United States Patent

Terrill

[11] Patent Number: 5,989,989
[45] Date of Patent: Nov. 23, 1999

[54] DIE AND CUBE REROUTE PROCESS

[75] Inventor: Robert E. Terrill, Carrollton, Tex.

[73] Assignee: Texas Instruments Incorporated, Dallas, Tex.

[21] Appl. No.: 08/866,108

[22] Filed: May 30, 1997

Related U.S. Application Data

[60] Provisional application No. 60/018,738, May 31, 1996.

[51] Int. Cl.$^6$ ................................................. H01L 21/60
[52] U.S. Cl. ........................ 438/598; 438/618; 438/656; 438/679; 438/940
[58] Field of Search ..................................... 438/598, 109, 438/612, 618, 666, 648, 650, 652, 656, 669, 679, 940

[56] References Cited

U.S. PATENT DOCUMENTS

| | | | |
|---|---|---|---|
| 3,951,708 | 4/1976 | Dean | 156/3 |
| 4,898,648 | 2/1990 | Cusano | 204/15 |
| 5,055,319 | 10/1991 | Bunshah et al. | 427/38 |
| 5,126,286 | 6/1992 | Chance | 438/203 |
| 5,239,131 | 8/1993 | Hoffman et al. | 174/52.4 |
| 5,386,430 | 1/1995 | Yamagishi et al. | 372/57 |
| 5,449,955 | 9/1995 | Debiec et al. | 257/751 |
| 5,652,559 | 7/1997 | Saia et al. | 335/78 |
| 5,653,019 | 8/1997 | Bernhardt et al. | 29/840 |
| 5,657,206 | 8/1997 | Pendersen et al. | 361/772 |
| 5,754,216 | 5/1998 | Higuchi et al. | 347/238 |
| 5,834,162 | 11/1998 | Malba | 430/317 |

Primary Examiner—Olik Chaudhuri
Assistant Examiner—Kurt Eaton
Attorney, Agent, or Firm—Wade James Brady, III; Richard L. Donaldson

[57] ABSTRACT

A method of creating a rerouting pattern on a semiconductor die or cube by providing a semiconductor die having an active surface with bond pads thereon and sides. A layer of electrically insulating material is sputtered over the active surface and the sides while exposing the bond pads. Electrically conductive material is formed over the electrically insulating material on the active surface and the sides. A selected portion of the electrically conductive material is removed with an excimer laser. The step of sputtering a layer of electrically insulating material over the active surface and said sides can include the steps of sputtering a layer of electrically insulating material over the active surface including the bond pads and the sides, masking the electrically insulating material to expose the region of the electrically insulating material over the bond pads and ablating the electrically insulating material with an excimer laser at the exposed region down to said bond pads. The step of forming electrically conductive material over the electrically insulating material comprises the steps of forming a layer of Ti followed by a layer of Pd followed by a layer of Au. The electrically conductive material is formed over the electrically insulating material by a modified evaporation process. Solder receiving regions are provided on one of the sides of the die or cube and the die or cube is disposed so that the solder receiving regions contact a circuit board and are soldered to the circuit board.

25 Claims, 1 Drawing Sheet

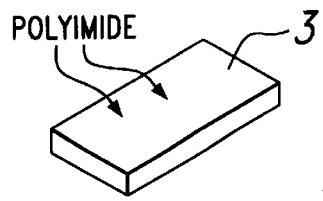
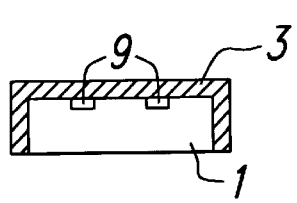
Fig. 1a     Fig. 1b
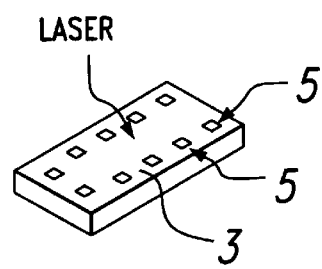
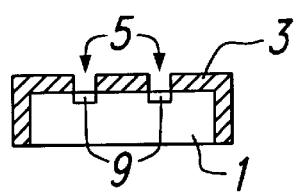
Fig. 2a     Fig. 2b
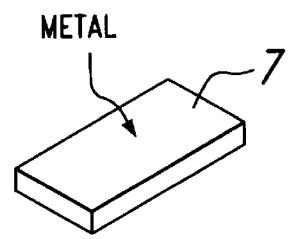
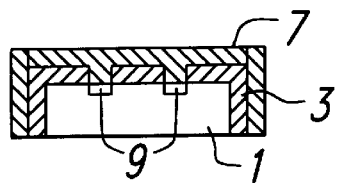
Fig. 3a     Fig. 3b
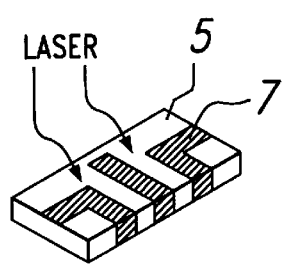
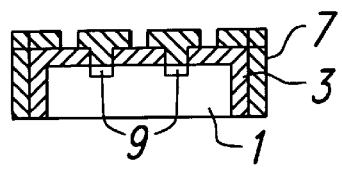
Fig. 4a     Fig. 4b
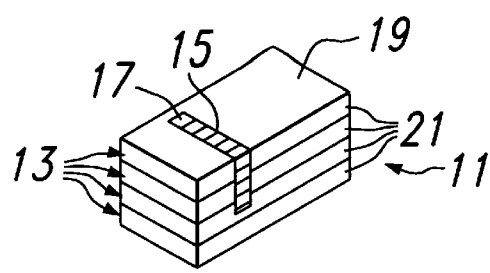
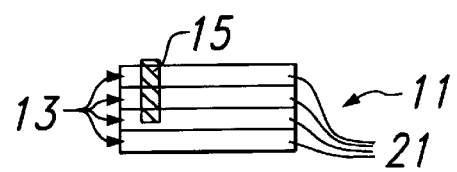
Fig. 5a     Fig. 5b

DIE AND CUBE REROUTE PROCESS

This Application claims priority under 35 USC 119 (e)(l) of provisional application Ser. No. 60/018,738, filed May 31, 1996.

BACKGROUND OF THE INVENTION

1. Field of the Invention

This invention relates to a method of creating a rerouting pattern on the active surface and/or edge or end surface of a die or cube.

2. Brief Description of the Prior Art

Procedures for the creation of rerouting patterns on semiconductor dice or cubes (a plurality of stacked dice) have been used in the prior art. Such rerouting generally involves the use of thin films which is very costly and provides a liquid waste byproduct which must be disposed of. Once the die has been rerouted, the prior art may include a further thin film routing on the cube face. In addition, once rerouting is completed, a procedure is required for transmission of signal to and from the die. It follows that the rerouting techniques of the prior art are expensive and that simplified procedures for such rerouting are highly desirable.

SUMMARY OF THE INVENTION

In accordance with the present invention, there is provided a process for reroute fabrication which requires far less steps than are required by prior art reroute procedures, which provides an economic advantage over the prior art and which avoids the generation of a liquid waste byproduct which would require costly disposition.

Briefly, the above is accomplished by providing a chip having bond pads to which electrically conductive path rerouting is desired. The rerouting is accomplished by initially depositing in vapor form, a layer of electrically insulating material, preferably a polyimide, so that it covers both the active or top surface and edges of the chip. Sputtering is essential to insure insulation of the active surface of the die as well as the die sidewalls or edges. The polyimide is then masked and the exposed polyimide, which is the portion of the polyimide over the bond pads to which rerouting is to take place, is ablated by exposing the entire top and edge surfaces of the chip to an excimer laser. An excimer laser is essential because, relative to other lasers, the excimer laser beam ablates large areas concurrently (on the order of 1 cm$^2$) compared to other lasers, such as $C0_2$, and the energy level of the excimer laser is readily controllable. The result is that the insulator is ablated from the regions over the bond pads to provide vias over the bond pads. Metal is then formed over the entire upper surface and edges of the chip over the insulator layer and into the vias to make contact with the bond pads. The metal layer is preferably fabricated by depositing onto the active or top surface and the sides or edges an electrically conductive layer, preferably titanium (Ti) followed by a layer of palladium (Pd) followed by a layer of gold (Au) or other appropriate electrically conductive metal or chromium (CR) followed by a layer of nickel (Ni) followed by a layer of gold (Au) or other appropriate electrically conductive metal. The layers of metal are preferably deposited by a modified evaporation process, such as shown in U.S. Pat. Nos. 4,016,389, 4,420,386 or 4,039,416, the contents of which are incorporated herein by reference, though any technique which will deposit the metal on the active surface as well as the sides can be used. A mask is then provided over the metal and the exposed metal is ablated by an excimer laser by moving the laser beam relative to the metal such as by changing the direction of the laser beam and flipping the die on its side for laser ablation on the die edge to provide a metal conductor pattern on the active surface of the die as well as along one or more of the edges of the die. The die can then be soldered to a printed circuit board or the like by soldering the metal conductive areas at an edge or side of the die to the printed circuit board in standard manner. These metal conductive areas on the die side will be coupled to a portion of the pattern which runs over the active surface of the die and to the metal in the vias which extend to the bond pads.

In accordance with a second embodiment of the invention, the die is initially patterned with a mask over the bond pads in standard manner and the polyimide is sputtered onto the exposed active surface and edges of the die and over the mask. When the mask is removed along with the polyimide thereover, the partially fabricated reroute will include the die having the polyimide thereover with vias extending to the bond pads, this being the same structure as ultimately obtained in accordance with the first embodiment as discussed above. Processing then proceeds in the same manner as discussed above with regard to the first embodiment.

In the case of a cube, wherein a plurality of dice are stacked one upon the other, the rerouting takes place in the same manner as described above for a single die except that the patterning on the edges of the dice will extend over one or more of the dice to provide interconnect between dice as well as to external devices.

BRIEF DESCRIPTION OF THE DRAWINGS

FIGS. 1a, 2a, 3a and 4a represent a process flow for rerouting conductive paths to bond pads on a chip in accordance with the present invention;

FIGS. 1b, 2b, 3b and 4b are cross-sectional views of FIGS. 1a, 2a, 3a and 4a respectively; and FIGS. 5a and 5b are perspective and side views respectively of a cube after rerouting has taken place.

DESCRIPTION OF THE PREFERRED EMBODIMENTS

Referring first to FIGS. 1a and 1b, there is shown a chip 1 having bond pads 9 thereon wherein it is desired to reroute conductive paths to these bond pads. The rerouting is accomplished by initially sputtering a layer of electrically insulating polyimide so that it cover both the active or top surface and edges of the chip 1 as shown in FIGS. 1a and 1b. The chip is then masked and the exposed polyimide is ablated by exposing the entire top and edge surfaces of the chip to an excimer laser using a relatively large area of the laser beam. The result is that the polyimide 3 is ablated from the regions over the bond pads 9 to provide vias 5 over the bond pads as shown in FIGS. 2a and 2b. Metal 7 is then formed over the entire upper surface and edges of the chip over the polyimide layer 3 and into the vias 5 to make contact with the bond pads 9 as shown in FIGS. 3a and 3b. The metal layer 7 is preferably fabricated by depositing onto the active or top surface and the sides or edges a layer of titanium (Ti) followed by a layer of palladium (Pd) followed by a layer of gold (Au). The layers of metal are preferably deposited by a modified evaporation process, though any technique which will deposit the metal on the active surface and sides can be used. A mask is then provided over the metal 7 and the exposed metal is ablated by an excimer laser to provide a metal conductor pattern on the active surface of the die as well as along one or more of the edges of the die. The die can then be soldered to a printed circuit board or the like by soldering the metal conductive areas at an edge or side of the die to the printed circuit board in standard manner. These metal conductive areas on the die side will be coupled to a portion of the pattern which runs over the active surface of the die and to the metal in the vias 5 which extend to the bond pads 9. The metal conductive areas on one side of the die can then be disposed on a printed circuit board for soldering to the printed circuit board in standard manner.

In accordance with a second embodiment of the invention, the die 1 is initially patterned with a mask over the bond pads 9 in standard manner and the polyimide 3 is sputtered onto the exposed active surface and edges of the die and over the mask. When the mask is removed along with the polyimide thereover, the partially fabricated reroute will look the same as in FIGS. 2*a* and 2*b*. Processing then proceeds in the same manner as discussed above with regard to FIGS. 3*a*, 3*b* and 4*a*, 4*b*.

Referring now to FIG. 5*a* and 5*b*, there is shown a cube 11 composed of a plurality of dice 13 in a stack. As can be seen, an electrically conductive pattern 15 extends from bond pads 17 along the active surface 19 of an end die and then along the edges 21 of one or more of the dice. The pattern is fabricated in the same manner as discussed above with regard to one die except that the edge of the one die embodiment is replaced by the plurality of stacked edges.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of creating a rerouting pattern on a semiconductor die or cube which comprises the steps of:
   (a) providing a semiconductor die or cube having a bond pad-containing surface and sides extending from said bond pad-containing surface;
   (b) masking said bond pads;
   (c) sputtering a layer of electrically insulating material over said bond pad-containing surface and at least one of said sides and then unmasking said bond pads;
   (d) forming electrically conductive material over said electrically insulating material on said bond pad-containing surface and said at least one of said sides extending to and over said bond pads; and
   (e) removing a selected portion of said electrically conductive material with an excimer laser.

2. The method of claim 1 wherein said step of sputtering a layer of electrically insulating material over said active surface and said sides comprises the steps of sputtering a layer of electrically insulating material over said active surface including said bond pads and said sides, masking said electrically insulating material to expose the region of said electrically insulating material over said bond pads and ablating said electrically insulating material with an excimer laser at the exposed region down to said bond pads.

3. The method of claim 1 wherein said step of forming electrically conductive material over said electrically insulating material comprises the steps of forming a layer of Ti followed by a layer of Pd followed by a layer of Au.

4. The method of claim 2 wherein said step of forming electrically conductive material over said electrically insulating material comprises the steps of forming a layer of Ti followed by a layer of Pd followed by a layer of Au.

5. The method of claim 1 wherein said electrically conductive material is formed over said electrically insulating material by a modified evaporation process.

6. The method of claim 2 wherein said electrically conductive material is formed over said electrically insulating material by a modified evaporation process.

7. The method of claim 3 wherein said electrically conductive material is formed over said electrically insulating material by a modified evaporation process.

8. The method of claim 4 wherein said electrically conductive material is formed over said electrically insulating material by a modified evaporation process.

9. The method of claim 1 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

10. The method of claim 2 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

11. The method of claim 3 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

12. The method of claim 4 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

13. The method of claim 5 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

14. The method of claim 6 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

15. The method of claim 7 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

16. The method of claim 8 wherein said step of removing a selected portion of said electrically conductive material with an excimer laser further includes the step of providing solder receiving regions on one of said sides of said die, disposing said die so that said solder receiving regions contact a circuit board and soldering said solder receiving regions to said circuit board.

17. A method of creating a rerouting pattern on a semiconductor die or cube which comprises the steps of:
   (a) providing a semiconductor die or cube having a bond pad-containing surface and sides extending from said bond pad-containing surface;
   (b) sputtering a layer of electrically insulating layer over said bond pad-receiving surface and at least one of said sides while exposing said bond pads;
   (c) forming electrically conductive material by a modified evaporation process over said electrically insulating material on said bond pad-receiving surface and said at least one of said sides; and
   (d) removing a selected portion of said electrically conductive material with an excimer laser by providing solder receiving regions on said one of said sides of said die or cube, disposing said die or cube so that said solder receiving regions on said one of said sides contact a circuit board and soldering said solder receiving regions to said circuit board.

18. The method of claim 17 wherein said step of sputtering a layer of electrically insulating material over said active surface and said sides comprises the steps of sputtering a layer of electrically insulating material over said active surface including said bond pads and said sides, masking said electrically insulating material to expose the region of said electrically insulating material over said bond pads and ablating said electrically insulating material with an excimer laser at the exposed region down to said bond pads.

19. The method of claim 17 wherein said step of forming electrically conductive material over said electrically insulating material comprises the steps of forming a layer of Ti followed by a layer of Pd followed by a layer of Au.

20. The method of claim 18 wherein said step of forming electrically conductive material over said electrically insulating material comprises the steps of forming a layer of Ti followed by a layer of Pd followed by a layer of Au.

21. The method of claim 1 wherein said step of removing a selected portion of said electrically conductive material with an excimer laser retains at least some of said electrically conductive material on at least one of said sides.

22. The method of claim 21 further including the step of securing said die or cube to a printed circuit board by a said side retaining at least some of said electrically conductive material.

23. The method of claim 8 wherein said step of removing a selected portion of said electrically conductive material with an excimer laser retains at least some of said electrically conductive material on at least one of said sides.

24. The method of claim 23 further including the step of securing said die or cube to a printed circuit board by a said side retaining at least some of said electrically conductive material.

25. A method of creating a rerouting pattern on a semiconductor die or cube which comprises the steps of:
   providing a semiconductor die or cube having an active bond pad-containing surface and sides extending from said active bond pad-containing surface;
   forming a layer of electrically insulating material over said bond pad-containing surface and at least one of said sides and leaving said bond pad unmasked;
   forming patterned electrically conductive material over said electrically insulating material on said bond pad-containing surface and said at least one of said sides, said electrically conductive material extending to and contacting said unmasked bond pad.

* * * * *